(12) United States Patent
Gidon et al.

(10) Patent No.: US 7,719,951 B2
(45) Date of Patent: May 18, 2010

(54) DATA RECORDING DEVICE COMPRISING INCLINED CARBON NANOTUBES AND METHOD FOR THE PRODUCTION THEREOF

(75) Inventors: Serge Gidon, La Murette (FR); Jean Dijon, Champagnier (FR); Helene Le Poche, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 716 days.

(21) Appl. No.: 11/663,434

(22) PCT Filed: Oct. 11, 2005

(86) PCT No.: PCT/FR2005/002505

§ 371 (c)(1),
(2), (4) Date: Mar. 21, 2007

(87) PCT Pub. No.: WO2006/042933

PCT Pub. Date: Apr. 27, 2006

(65) Prior Publication Data

US 2008/0186827 A1 Aug. 7, 2008

(30) Foreign Application Priority Data

Oct. 15, 2004 (FR) .................................. 04 10960

(51) Int. Cl.
   *G11B 7/00* (2006.01)
(52) U.S. Cl. ........................................ 369/126; 369/100
(58) Field of Classification Search ........................ None
   See application file for complete search history.

(56) References Cited

U.S. PATENT DOCUMENTS

| 4,916,688 | A | 4/1990 | Foster et al. |
| 6,401,526 | B1 | 6/2002 | Dai et al. |
| 6,457,350 | B1 | 10/2002 | Mitchell |
| 6,519,221 | B1 | 2/2003 | Manalis et al. |
| 6,715,346 | B2 * | 4/2004 | Shuman ..................... 250/307 |
| 7,385,901 | B2 * | 6/2008 | Cho et al. ................. 369/59.23 |
| 7,502,304 | B2 * | 3/2009 | Maeda et al. ............... 369/126 |

(Continued)

FOREIGN PATENT DOCUMENTS

EP  1 341 183 A1  9/2003

(Continued)

OTHER PUBLICATIONS

M. Chhowalla et al., "Growth Process Conditions of Vertically aligned Carbon Nanotubes Using Plasma Enhanced Chemical Vapor Deposition," Journal of Applied Physics, vol. 90, No. 10, pp. 5308-5317, Nov. 15, 2001.

*Primary Examiner*—Muhammad N. Edun
(74) *Attorney, Agent, or Firm*—Oliff & Berridge, PLC

(57) ABSTRACT

The data recording device comprises a network of carbon nanotubes formed on a flat substrate and constituting microtips operating in conjunction with a substantially flat storage medium. The carbon nanotubes are initially inclined by a predetermined angle comprised between 5° and 40° with respect to the plane of the substrate. The nanotubes flex when they come into contact with the storage medium, parallel to the substrate. The substrate preferably comprises a raised structure designed to act as support for the free ends of the nanotubes to bear on.

8 Claims, 7 Drawing Sheets

U.S. PATENT DOCUMENTS

| | | |
|---|---|---|
| 2002/0122766 A1 | 9/2002 | Lieber et al. |
| 2002/0172072 A1 | 11/2002 | Chen et al. |
| 2004/0009308 A1 | 1/2004 | Schlaf et al. |
| 2004/0072994 A1 | 4/2004 | Herr et al. |

FOREIGN PATENT DOCUMENTS

| | | |
|---|---|---|
| WO | WO 00/19494 | 4/2000 |
| WO | WO 03/060923 A1 | 7/2003 |
| WO | WO 2004/032132 A2 | 4/2004 |

* cited by examiner

DATA RECORDING DEVICE COMPRISING INCLINED CARBON NANOTUBES AND METHOD FOR THE PRODUCTION THEREOF

BACKGROUND OF THE INVENTION

The invention relates to a data recording device comprising a network of carbon nanotubes constituting microtips cooperating with a substantially flat storage medium, and also to a method for the production of one such device.

STATE OF THE ART

Data recording, both in the computer field and in the multimedia field, is having to meet an ever increasing capacity requirement. Different techniques have been developed ranging from the magnetic hard disk to optical storage memories, and including solid memories (flash memories). Whatever the recording technique used, the size of the memory dots (bits) is always sought to be reduced and increasing the recording capacity results from increasing the storage density.

Using microtip networks enables very large storage capacities to be obtained, about a Terabit/cm$^2$. As represented in FIG. 1, a microtip 1 is selectively brought into contact with a nanometric storage dot 2 of a storage layer 3 formed on a substrate 4. The substrate 4 and the storage layer 3 form a storage medium 5. An actuator (not shown) enables a relative movement of the microtip network and of the storage medium in parallel and/or perpendicularly to the storage medium. Data writing in a storage dot is performed by selective addressing of a microtip disposed facing this storage dot and modification of the physical, electrical and/or magnetic properties of this storage dot. This modification is conventionally achieved by thermal effect or by means of an electric current flowing through the microtip, causing for example a phase change of the storage dot material and/or a modification of the resistivity of the storage dot (U.S. Pat. No. 4,916,688).

To guarantee a perfect contact of all the microtips 1 of a network with the associated storage medium 5 and to soften the mechanical contact between the microtip and the storage dot, each microtip is conventionally mounted at one end of a cantilever, in particular in the document WO-A-2003/060923. In this document, the resolution can be improved by the use of carbon nanotubes embedded in the microtips. As represented in FIG. 2, a carbon nanotube 6 can be formed at the free end of each microtip, itself placed at the end of a cantilever 7 securely fixed to a body 8.

The use of carbon nanotubes formed at the end of conical or pyramidal support tips is also described in U.S. Pat. No. 6,401,526 for fabrication of microtips in the atomic force microscopy field.

The document WO-A-2004/032132 describes another solution to the problem of height dispersion of the microtips consisting in associating a storage medium in the form of a flexible membrane, preferably supported by a frame forming a plurality of recesses, with a network of microtips formed directly on a base. An electronic circuit for addressing the microtips and control of data write and/or read in the memory can then be integrated in the base bearing the microtips. The latter solution simplifies fabrication of the memory and consequently reduces the cost thereof. However, the storage medium does remain fairly complex to achieve, in so far as it has to follow the outline of the microtip network deformations and even out the height dispersions of the microtips, while at the same time avoiding developing too large bearing forces on the storage medium.

OBJECT OF THE INVENTION

One object of the invention is to provide a data recording device, in particular for ultra-high density storage memories, that does not present the above shortcomings and, more particularly, that enables the height dispersion of the microtips to be ignored, while at the same time reducing the manufacturing cost of the device.

According to the invention, this object is achieved by the fact that the carbon nanotubes are formed on a substantially flat substrate that is parallel to the storage medium, and are inclined with respect to the plane of the substrate.

According to a development of the invention, each nanotube comprises a free end and a base end securely fixed to the substrate, each nanotube forming at its base an initial angle comprised between 5° and 40° with an axis perpendicular to said plane.

According to another development of the invention, the substrate comprises a raised structure designed to act as support for the free ends of the nanotubes.

It is a further object of the invention to provide a method for the production of a data recording device. This method is characterized in that it comprises growth of the nanotubes on a substrate that is inclined with respect to an electric field defining a growth axis of the nanotubes.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
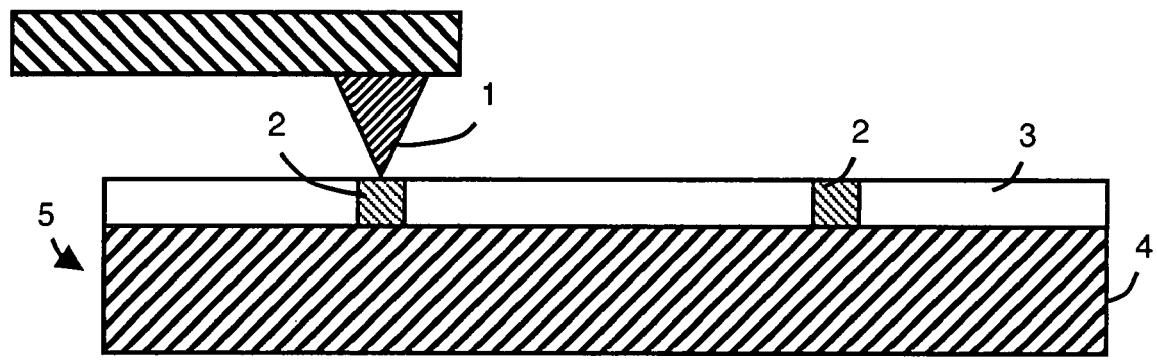
FIG. 1 schematically illustrates the principle of a data recording with microtips according to the prior art.
Figure 2:
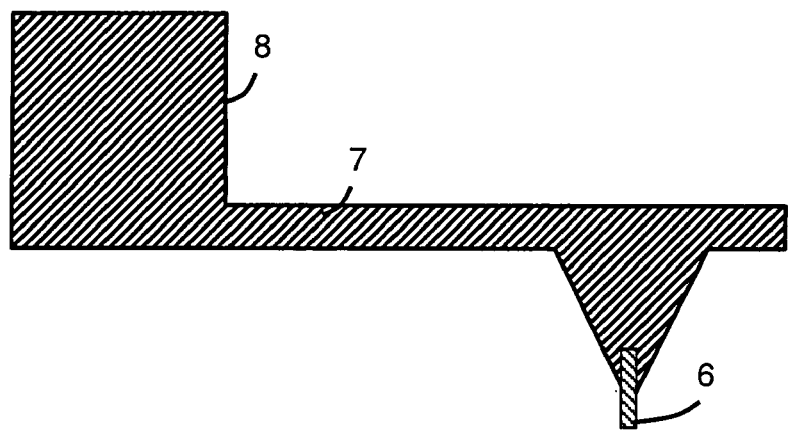
FIG. 2 represents a microtip according to the document WO-A-2003/060923.
Figure 3:
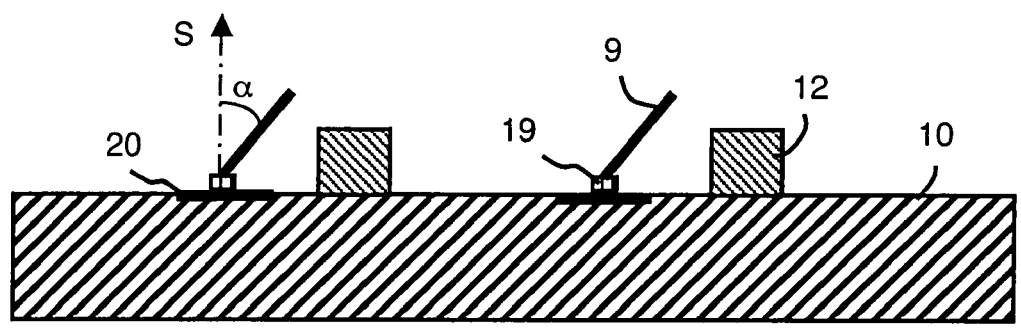
FIG. 3 schematically illustrates a microtip network of a device according to the invention.

As represented in FIG. 3, the microtip network of a device according to the invention is formed by a set of nanotubes 9 which are inclined with respect to the plane of a substrate 10 whereon they are formed. The nanotubes 9 form the microtips designed to operate in conjunction with a substantially flat storage medium (not shown in FIG. 3), parallel to the substrate 10, for writing and/or reading of data in the storage medium.

Each nanotube 9 comprises a free end designed to come into contact with the storage medium and a base end securely fixed to the substrate 10. The initial angle α that the nanotube forms at its base with an axis S perpendicular to the plane of the substrate 10 is preferably comprised between 5° and 40°. In a preferred embodiment, the initial angle α is about 10°.

Whereas vertical nanotubes, such as those described in the prior art in particular in the documents WO-A-2003/060923 and U.S. Pat. No. 6,401,526, are extremely rigid when they are in contact with a horizontal storage medium, the inclined nanotubes 9 present a certain flexibility. They then in fact work in flexion and their stiffness is reduced. For example, an inclined nanotube having a length of a few hundred nanometers (100 to 500 nm) and an external diameter of 1 to 50 nm has a stiffness of about a few N/m.

Figure 5:
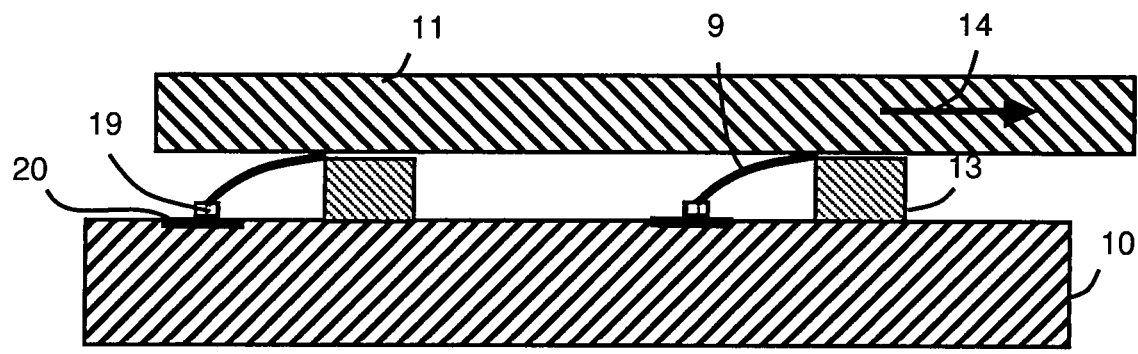
Figure 7:
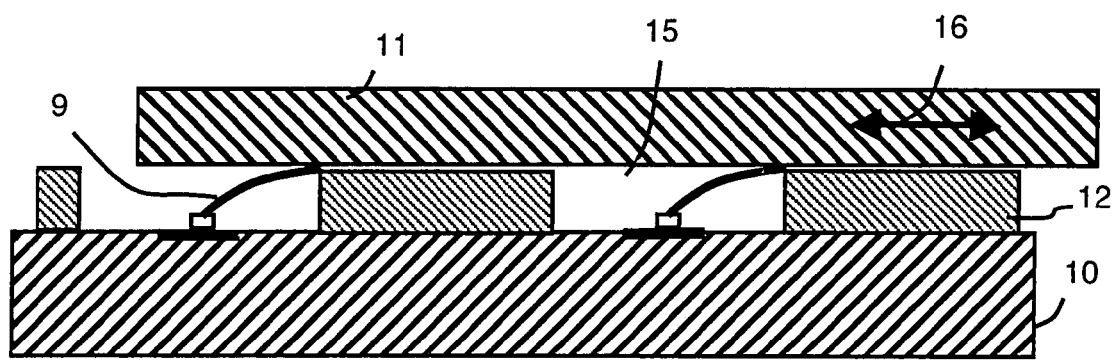
Figure 8:
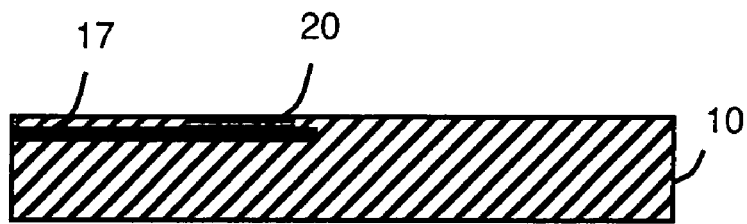
FIGS. 8 to 15 represent successive steps of a particular embodiment of a method for the production of a device according to the invention.
Figure 9:
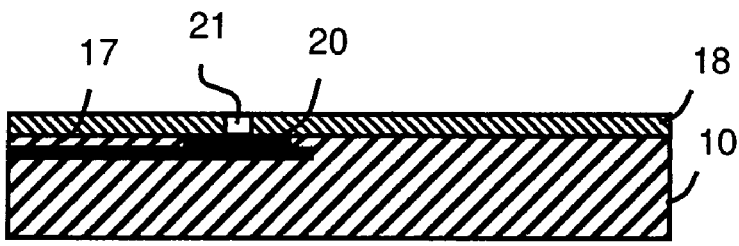
Figure 10:
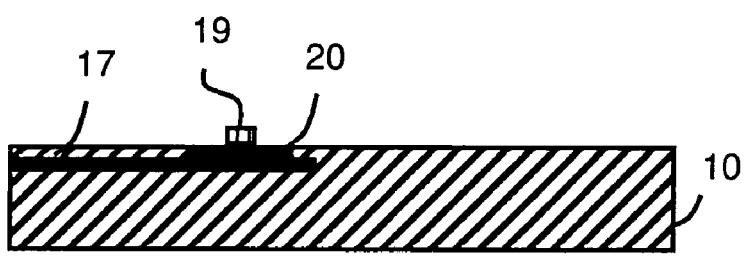

As represented in FIGS. 5 and 7, the nanotubes 9 bend when they come into contact with a storage medium 11, parallel to the substrate 10. This bending enables the bearing forces exerted by the nanotubes 9 on the storage medium 11 to be limited and the inevitable dispersions in the length of the nanotubes to be compensated by the more or less large curvature of the latter. Moreover, bending of the nanotubes absorbs any distance variations, of some tens of nanometers, that may occur between the storage medium 11 and the substrate 10.

A nanotube with a length of a few hundred nanometers does however tend to vibrate under the action of external stresses, such as the Brownian movements of the air molecules or the friction forces of the storage medium. These vibrations can in particular result in a loss of precision in the delineation of the memory dots. To overcome this drawback, the substrate 10 supporting the nanotubes 9 preferably comprises a raised structure 12 designed to act as support for the free ends of the nanotubes 9 to press on when the latter bend in contact with the storage medium 11. In this way, the bent nanotubes are stabilized in that they wedge themselves naturally on the raised structure 12.

Figure 4:
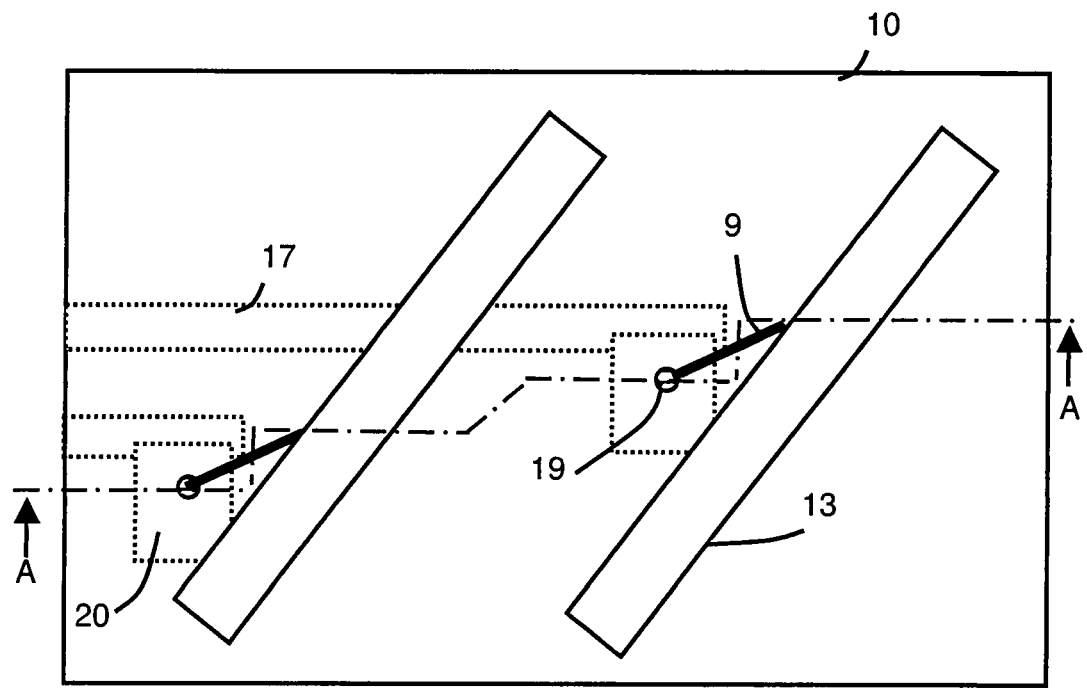
FIGS. 4 and 5 respectively represent a particular embodiment of a device according to the invention in top view (without the storage medium) and in cross-section along A-A (with the storage medium).

The patterns of the raised structure 12 can be of different shapes. In the embodiment of FIGS. 4 and 5, the raised structure is formed by parallel strips 13 between which the nanotubes 9 are located. This configuration is more particularly interesting in the case where the storage medium always moves in the same direction, schematized by the arrow 14 in FIG. 5 (horizontally, to the right, in the example represented). This is particularly the case in a memory in the form of a disk. As represented in FIG. 4, the strips 13, which can be straight or curved, are then preferably inclined with respect to the axis of movement (horizontal, schematized by the arrow 14 in FIG. 5) of the storage medium, in a direction parallel to the plane of the substrate. The nanotubes 9 then remain in a stable position when the storage medium passes. The distance separating the strips 13 can be constant and such that the base ends of the nanotubes 9, which constitute the anchoring points thereof, are arranged at equal distance from two adjacent strips.

Figure 6:
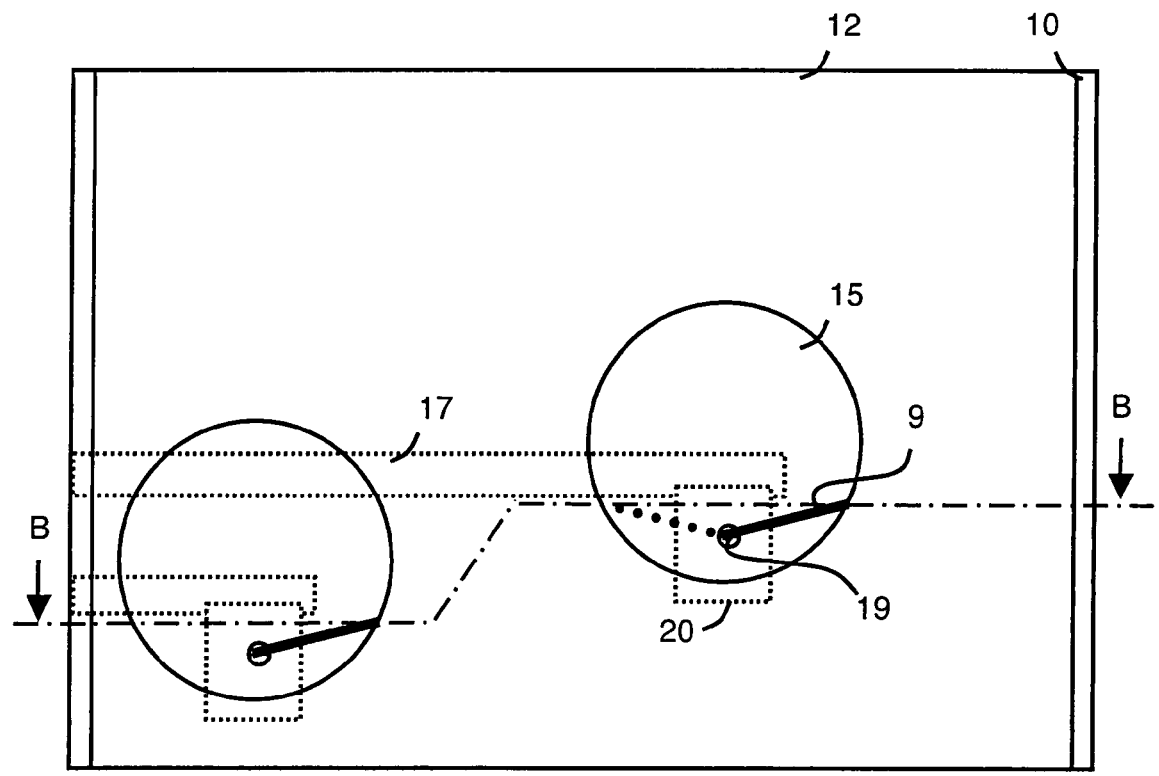
FIGS. 6 and 7 respectively represent another embodiment of a device according to the invention in top view (without the storage medium) and in cross-section along B-B (with the storage medium).

In the embodiment of FIGS. 6 and 7, the raised structure 12 is formed by a layer deposited on the substrate 10 and comprising holes 15 in which the nanotubes 9 are disposed. The holes 15 are preferably substantially cylindrical pass-through holes the diameter whereof can be about a micrometer. This structure enables a two-dimensional oscillating movement of the storage medium to be envisaged, as schematized by the arrow 16 in FIG. 7 (horizontally, to the right and/or to the left). Each nanotube 9 can then take two stable positions respectively represented in an unbroken line (to the right) and in a dotted line (to the left) for one of the nanotubes of FIG. 7. The initial angle of the nanotube is oriented in such a way that there is symmetry in the flexion movements of the nanotube according to the movement of the storage medium 11.

The raised structure 12 also enables the nanotubes 9 to be braced in the direction perpendicular to the substrate 10. Thus, when a relative movement of the storage medium 11 and substrate 10 takes place along the axis S, leading to the storage medium being moved away from the microtips, the nanotubes 9 are automatically kept in contact with the raised structure 12 by adhesion phenomena. The raised structure 12 can also act as a pad enabling the storage medium to be kept at a minimum distance from the substrate 10 preventing any accidental sticking of the storage medium 11 and substrate 10 which could result in destruction of the nanotubes 9.

For example, the height of the raised structure 12 can be about 100 to 200 nm for nanotubes with a length of 200 to 500 nm.

Fabrication of the device uses conventional microelectronics techniques and any known method for fabrication of carbon nanotubes. A nanotube growth process is in particular described in the article "Growth process conditions of vertically aligned carbon nanotubes using plasma enhanced chemical vapor deposition", published on 15 Nov. 2001 in "Journal of Applied Physics", vol. 90, no 10, p. 5308-5317.

The incline of the nanotubes 9 is obtained by making the nanotubes grow on a substrate that is inclined with respect to an electric field defining their growth axis. For this, the substrate 10 on which the nanotubes 9 are formed is inclined by an angle α with respect to the frame of a PECVD reactor (not shown) used for growth of the nanotubes.

In a preferred embodiment, the electronic circuit for addressing the microtips and controlling data writing and/or reading in the memory is integrated in the substrate 10 supporting the nanotubes. Formation of the nanotubes 9 on the inclined substrate then takes place after the electronic addressing and control circuit 17 has been formed in the substrate 10 and the raised structure 12 has been formed on the substrate 10.

In the production method illustrated in FIGS. 8 to 15, the electronic addressing and control circuit 17 is first of all formed (FIG. 8), in the form of an integrated circuit, for example by CMOS technology, in the substrate 10 for example made from silicon. Then (FIG. 9) a mask 18 is formed on the substrate 10, comprising the electronic circuit 17, by deposition followed by localized etching, for example by lithography of a photoresist or oxide layer. Catalyst pads 19 (Ni, Fe, FeNi, Co . . . ) are then formed (FIG. 10) on contact pads 20 of the electronic circuit 17, in corresponding holes 21 etched in the mask 18. The mask 18 can then be lifted-off if required.

Figure 11:
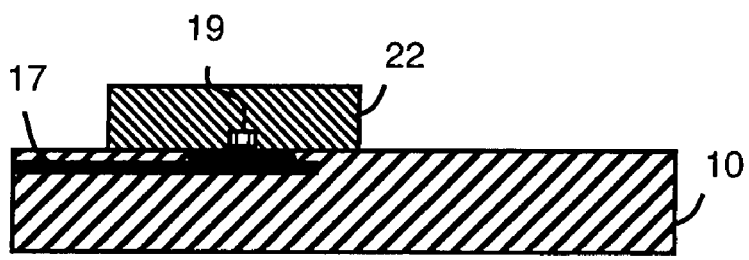
Figure 12:
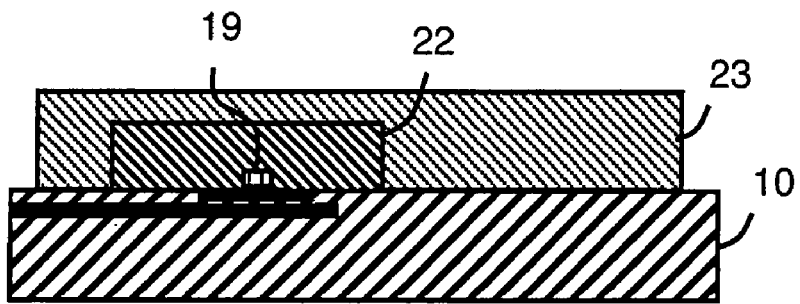
Figure 13:
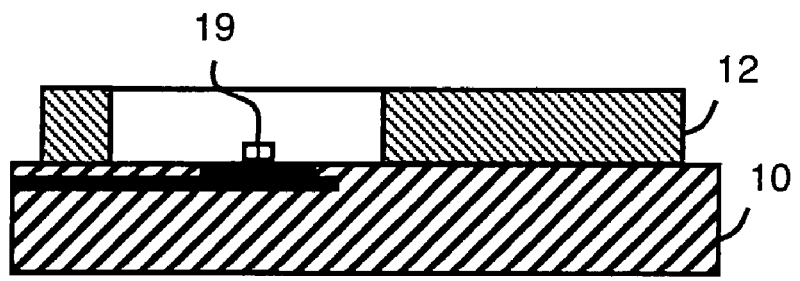
Figure 14:
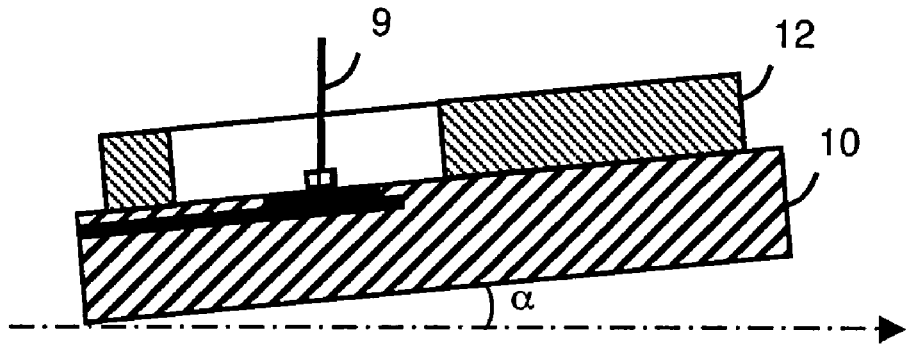

In the alternative embodiment represented in FIGS. 11 to 13, the raised structure 12 is then formed in three steps. First of all (FIG. 11), a sacrificial layer 22 is deposited on the substrate and structured, for example by photolithography, to occupy the zones designed to form the hollowed part of the raised structure. The sacrificial layer 22, which then covers the catalyst pads 19, is then covered by a layer 23 of material designed to form the raised structure. The material of the layer 23 is for example silica or any other friction-resistant material such as silicon nitride ($Si_3N_4$) or carbon (diamond-like carbon or amorphous carbon). After planarization, limiting the thickness of the layer 23 to the required height of the raised structure, smaller than the initial thickness of the sacrificial layer 22, the sacrificial layer 22 is eliminated (FIG. 13), which frees access to the catalyst pads 19 and completes the formation of the raised structure 12.

Figure 15:
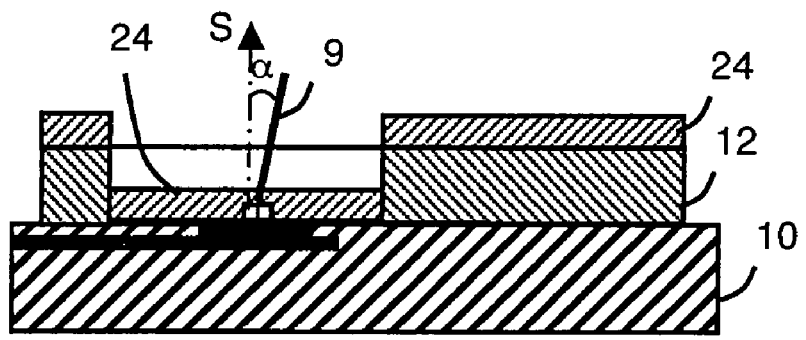

Vertical growth of the nanotubes 9 is then performed (FIG. 14) in known manner from catalyser pads 19, whereas the substrate 10 is inclined by an angle α with respect to the horizontal. Growth of the nanotubes 9 is performed in situ at a temperature typically of about 400° C., compatible with the electronic circuit 17. For example, the substrate is placed on a horizontal graphite sole (not shown) with which it makes said angle α. The temperature of the whole assembly is then heated to 400° C. in a hydrogen atmosphere for 30 minutes. A RF plasma is then activated with a power of 300 W for one hour, in the presence of hydrogen, which may contain a few percent of hydrocarbons (acetylene or ethylene for example). The nanotubes 9 formed in this way are thus automatically inclined and form the same angle α with the axis S perpendicular to the plane of the substrate 10, as represented in FIG. 15

It may be desirable to rigidify the base of the nanotubes 9, in particular to enhance the reliability of the mechanical securing thereof on the substrate 10, whatever the forces that are to be subsequently applied thereon (impacts or stresses in the rest position). For this purpose, a coating layer 24 made of insulating material is deposited on the substrate 10, at least in the bottom of the hollows of the structured layer 12, so as to cover the base of the nanotubes 9. In FIG. 15, the coating layer 24 covers the whole of the raised structure 12. The thickness of the coating layer 24 represents only a fraction of the height of the nanotubes 9. This coating layer 24 can be deposited by any suitable method, in particular by chemical vapor deposition (CVD), by cathode sputtering, by spin coating, etc., depending on the nature of the insulating material used. For example, a diamond-like carbon layer can be deposited by chemical vapor deposition from methane or carbon monoxide (CO). A layer of silicon nitride ($Si_3N_4$) can be deposited by cathode sputtering and a layer of silicon oxide ($SiO_2$) by spin coating, possibly by means of a sol-gel method (SOG: Spin on Glass).

Figure 16:
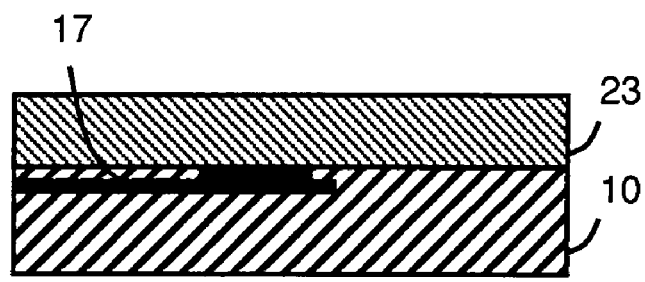
FIGS. 16 to 21 illustrate an alternative embodiment able to replace steps of FIGS. 9 to 13.
Figure 17:
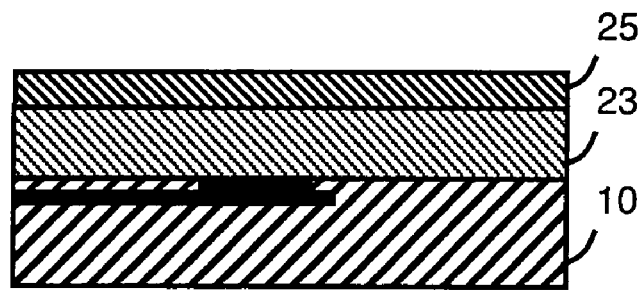
Figure 18:
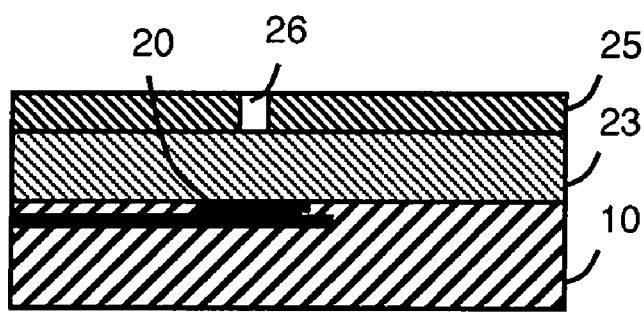
Figure 19:
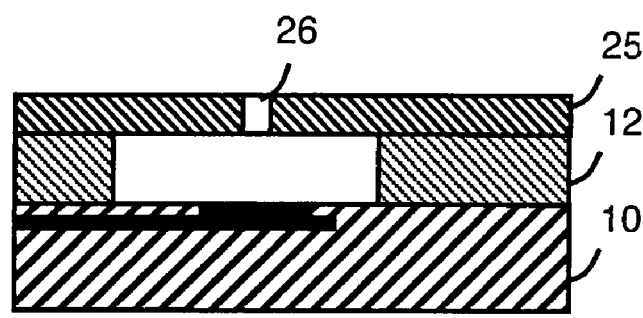
Figure 20:
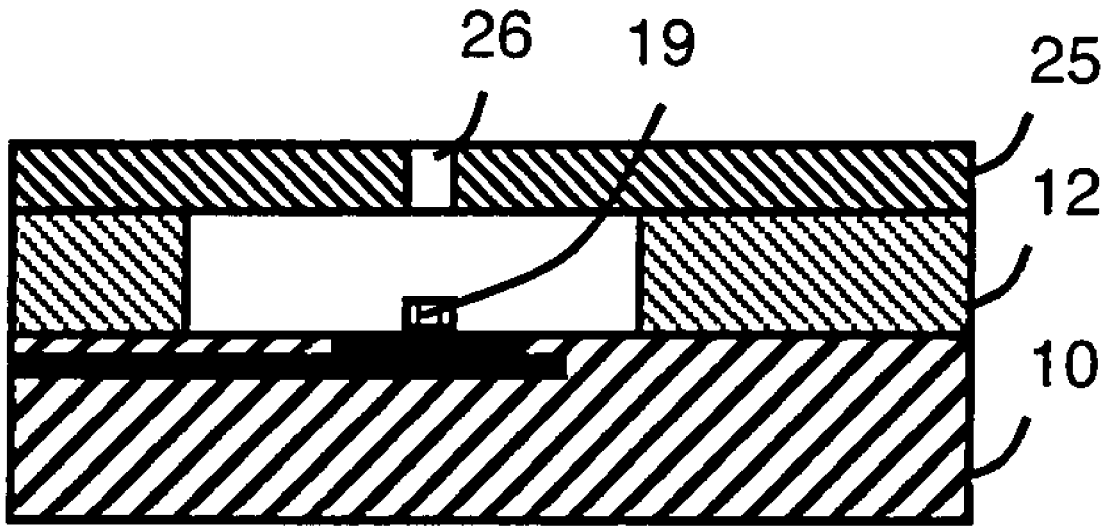
Figure 21:
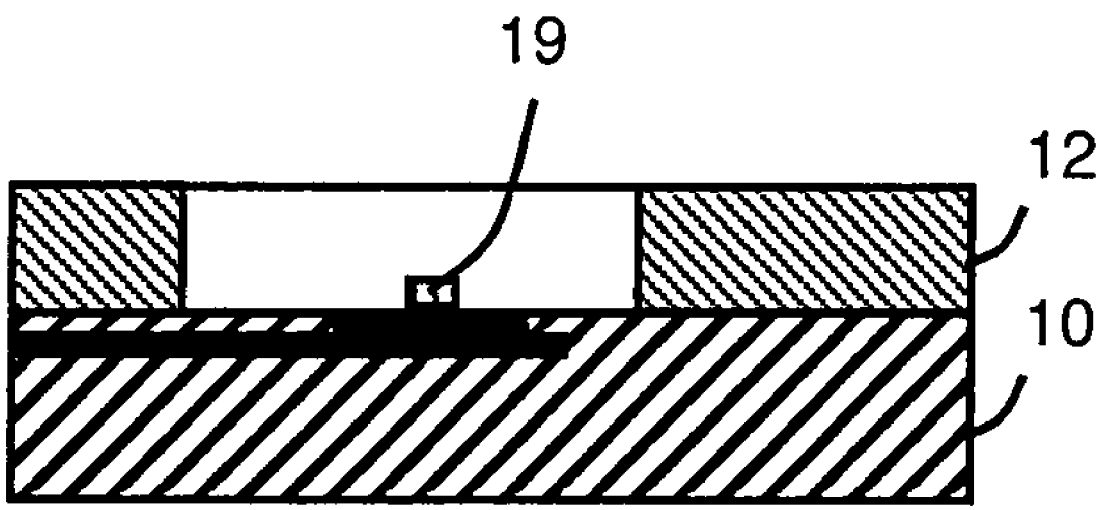

In an alternative embodiment, the steps of FIGS. 9 to 13 are replaced by the following steps, illustrated in FIGS. 16 to 21. As represented in FIG. 16, the layer 23 of material designed to constitute the raised structure is then deposited directly on the substrate 10, wherein the electronic circuit 17 has been previously formed. A photoresist layer 25 is then deposited on the layer 23 (FIG. 17). Holes 26 are then etched (FIG. 18) in the photoresist layer 25, facing locations designed for the catalyst pads 19, opposite the contact pads 20. This etching can for example be performed by photolithography or by any other equivalent method. The layer 23 is then etched through the holes 26 to form the hollow of the raised structure 12 (FIG. 19). The catalyst pads 19 are then formed on the contact pads 20, through the holes 26 (FIG. 20). Finally, as represented in FIG. 21, the layer 25 is lifted-off. In this alternative embodiment, there is self-alignment of the patterns of the raised structure and of the catalyst pads, with a single lithographic step. The nanotube growth and coating steps are then identical to those represented in FIGS. 14 and 15.

The invention is not limited to the embodiments described and represented. In particular, the storage medium 11 can be of any type, either rigid or flexible.

The invention claimed is:

1. Data recording device, comprising a network of carbon nanotubes constituting microtips cooperating with a substantially flat storage medium, device wherein the carbon nanotubes are formed on a substantially flat substrate that is parallel to the storage medium, and are inclined with respect to the plane of the substrate.

2. Device according to claim 1, wherein each nanotube comprises a free end and a base end securely fixed to the substrate, each nanotube forming at its base an initial angle comprised between 5° and 40° with an axis perpendicular to said plane.

3. Device according to claim 1, wherein said initial angle is about 10°.

4. Device according to claim 1, wherein the substrate comprises a raised structure designed to act as support for the free ends of the nanotubes to bear on.

5. Device according to claim 4, wherein the raised structure comprises a plurality of substantially cylindrical holes in which the nanotubes are disposed.

6. Device according to claim 4, wherein the raised structure comprises a plurality of parallel strips between which the nanotubes are disposed.

7. Device according to claim 6, wherein the base ends of the nanotubes are arranged at equal distance from two adjacent strips.

8. Method for the production of a device according to claim 1, comprising growth of the nanotubes on a substrate that is inclined with respect to an electric field defining an axis of growth of the nanotubes.

* * * * *